(12) United States Patent
Joshi

(10) Patent No.: US 10,999,919 B2
(45) Date of Patent: May 4, 2021

(54) FLEXIBLE ELECTRONIC ASSEMBLY FOR PLACEMENT ON A VEHICLE MOTOR ASSEMBLY

(71) Applicant: Toyota Motor Engineering & Manufacturing North America, Inc., Plano, TX (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/508,820

(22) Filed: Jul. 11, 2019

(65) Prior Publication Data

US 2021/0014958 A1    Jan. 14, 2021

(51) Int. Cl.
| | |
|---|---|
| *H05K 1/02* | (2006.01) |
| *H01L 23/31* | (2006.01) |
| *H01L 23/16* | (2006.01) |
| *H01L 23/373* | (2006.01) |
| *H01L 21/56* | (2006.01) |

(Continued)

(52) U.S. Cl.
CPC ........... *H05K 1/0203* (2013.01); *H01L 21/56* (2013.01); *H01L 23/16* (2013.01); *H01L 23/3121* (2013.01); *H01L 23/3735* (2013.01); *H01L 23/473* (2013.01); *H01L 24/32* (2013.01); *H05K 1/0271* (2013.01); *H01L 2224/291* (2013.01); *H01L 2224/32225* (2013.01)

(58) Field of Classification Search
CPC ...... H05K 1/189; H05K 1/14; H05K 7/20927; H05K 9/0081; H05K 1/142; H05K 3/284; H05K 1/0271; H01L 23/473; H01L 21/56; H01L 23/3121; H01L 23/16; H01L 23/3735; H01L 24/32; H01L 2224/291; H01L 2224/32225

See application file for complete search history.

(56) References Cited

U.S. PATENT DOCUMENTS

| | | | | |
|---|---|---|---|---|
| 5,155,299 | A | * | 10/1992 | Mahulikar ............ H01L 23/057 174/536 |
| 5,785,145 | A | * | 7/1998 | Wakao .................. B62D 5/0406 180/400 |
| 6,784,017 | B2 | | 8/2004 | Yang |

(Continued)

FOREIGN PATENT DOCUMENTS

| | | |
|---|---|---|
| CN | 102082102 A | 9/2015 |
| JP | S55111656 | 8/1980 |
| KR | 20180127690 A | 11/2018 |

*Primary Examiner* — Adam B Dravininkas
(74) *Attorney, Agent, or Firm* — Dinsmore & Shohl, LLP

(57) ABSTRACT

Embodiments of the disclosure relate to flexible electronic substrates for placement on an external surface of a vehicle motor assembly. In one embodiment, a motor assembly includes a motor comprising an external surface and one or more electronic assemblies positioned on the external surface of the motor. Each electronic assembly includes a metal substrate disposed on the external surface of the motor, a dielectric layer disposed on the metal substrate, a flexible metal base layer disposed on the dielectric layer, a bonding layer disposed on the flexible metal base layer, and one or more electronic devices disposed on the bonding layer. The bonding layer bonds the one or more electronic devices to the flexible metal base layer.

20 Claims, 6 Drawing Sheets

(51) Int. Cl.
    *H01L 23/00*     (2006.01)
    *H01L 23/473*     (2006.01)

(56) References Cited

U.S. PATENT DOCUMENTS

| | | | |
|---|---|---|---|
| 6,876,072 B1 * | 4/2005 | Wang | H01L 23/49838 257/678 |
| 10,014,745 B2 | 7/2018 | Fujimoto | |
| 2002/0005294 A1 | 1/2002 | Mayer | |
| 2011/0159688 A1 * | 6/2011 | Morgan | H01L 21/76879 438/674 |
| 2012/0069524 A1 * | 3/2012 | Schulz-Harder | H01L 23/3736 361/716 |
| 2012/0218714 A1 * | 8/2012 | Robert | H01L 23/053 361/713 |
| 2013/0250538 A1 * | 9/2013 | Le | B23K 1/19 361/807 |
| 2014/0268780 A1 * | 9/2014 | Wang | F21S 4/22 362/249.06 |
| 2015/0176877 A1 * | 6/2015 | Mori | F04B 39/121 417/410.1 |
| 2018/0006521 A1 * | 1/2018 | Fujimoto | B60R 16/023 |

\* cited by examiner

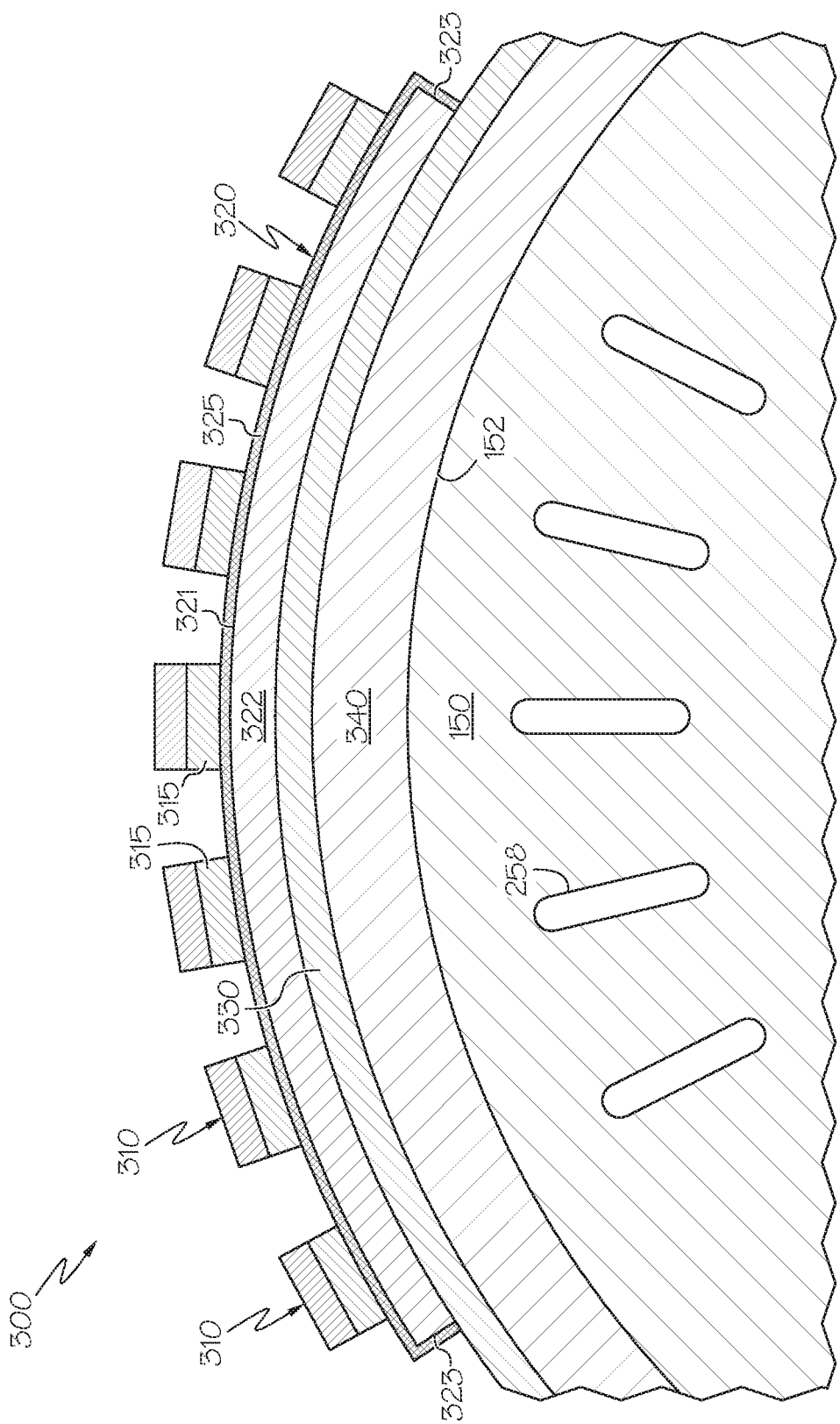

FLEXIBLE ELECTRONIC ASSEMBLY FOR PLACEMENT ON A VEHICLE MOTOR ASSEMBLY

TECHNICAL FIELD

The present specification generally relates to electronic assemblies, and more specifically, to a flexible electronic assembly for placement on an external surface of a vehicle motor assembly.

BACKGROUND

Electronic devices are often utilized in high-power electrical applications, such as inverter systems for hybrid vehicles and electric vehicles. The electronic devices may be power semiconductor devices such as power insulated-gate bipolar transistors (IGBTs) that are thermally bonded to a substrate. Flexible printed circuit board substrates (PCBs) for electronic devices and systems are also generally known for their use in high-power electrical applications and typically include plastic substrates.

With advances in battery technology in electric vehicles and increases in electronic device packaging density, operating temperatures of electronic devices have increased and are currently approaching 200° C. which result in increased thermomechanical stresses endured by the electronic devices. Due to variation in coefficient of thermal expansion (CTE) between the electronic device, the bonding layer, and the substrate, thermally-induced stresses may cause damage to the electronic assembly. For example, although bonding layers formed by transient liquid phase (TLP) bonding results in a bonding layer having a melting temperature greater than 200° C., such TLP bonding layers are very brittle and susceptible to damage from the thermally-induced stresses.

Structures and materials that mitigate the thermally-induced stresses in electronic devices are thus very desirable. Dedicated cooling mechanisms and systems may be typically employed to cool the electronic devices and keep them below a maximum operating temperature. However, such cooling systems can be complicated and expensive.

SUMMARY

The present specification relates to flexible electronic substrates for placement on an external surface of a vehicle motor assembly. In one embodiment, an electronic assembly includes a metal substrate operable to be disposed on a curved surface, a dielectric layer disposed on the metal substrate, a flexible metal base layer disposed on the dielectric layer, a bonding layer disposed on the flexible metal base layer, and one or more electronic devices disposed on the bonding layer. The bonding layer bonds the one or more electronic devices to the flexible metal base layer.

In another embodiment, a motor assembly includes a motor comprising an external surface and one or more electronic assemblies positioned on the external surface of the motor. Each electronic assembly includes a metal substrate disposed on the external surface of the motor, a dielectric layer disposed on the metal substrate, a flexible metal base layer disposed on the dielectric layer, a bonding layer disposed on the flexible metal base layer, and one or more electronic devices disposed on the bonding layer. The bonding layer bonds the one or more electronic devices to the flexible metal base layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3 depicts a side view of an example electronic assembly with a flexible metal base layer mounted on the external surface of the vehicle motor assembly, according to one or more embodiments shown and described herein;

DETAILED DESCRIPTION

Embodiments described herein are directed to a flexible electronic assembly for placement on an external surface of a vehicle motor assembly. Electronic devices, such as semiconductor chips, are coupled to flexible electronic substrates (as a non-limiting example, by a solder layer) acting as ground plane to form the flexible electronic assembly. The electronic devices are thus locally placed on the vehicle motor assembly, but at the same time are electrically isolated from the vehicle motor assembly by a dielectric layer. The proximity to one or more cooling channels within the vehicle motor assembly enables the electronic devices to be cooled by the coolant fluid flowing through the cooling channels. This removes the necessity for additional dedicated cooling mechanisms for the electronic devices.

Additionally, a flexible metal base layer may be disposed between the electronic devices and the metal substrate of the electronic assembly containing the electronic device. The flexible metal base layer includes a stress buffer layer of a phase change material having a low melting temperature (e.g., indium, tin, bismuth, paraffin wax, low-melting alloy, and the like) and may be encapsulated by a thin layer of a metal of high melting temperature. The phase change material melts into liquid form within the encapsulating layer when the electronic assembly operates at a temperature above the melting temperature of the phase change material, thereby absorbing the thermally-induced stresses generated by the electronic devices. The encapsulating layer maintains the stress buffer layer both when the phase change material is in a solid form and a liquid form thus rendering flexibility to the flexible metal base layer.

Figure 1:
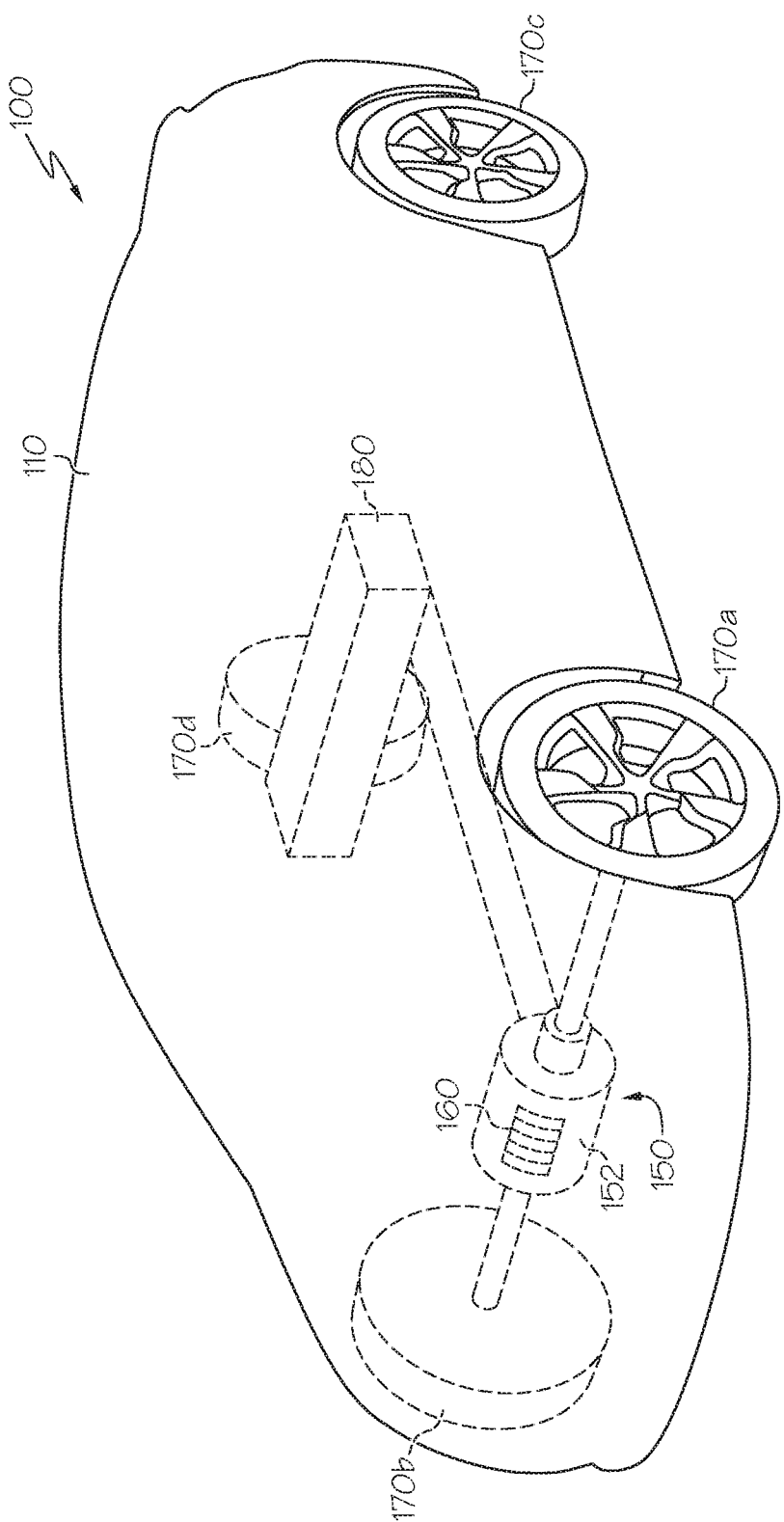
FIG. 1 depicts a vehicle having a plurality of electronic assemblies disposed on an external surface of the vehicle motor, according to one or more embodiments shown and described herein.
Figure 2A:
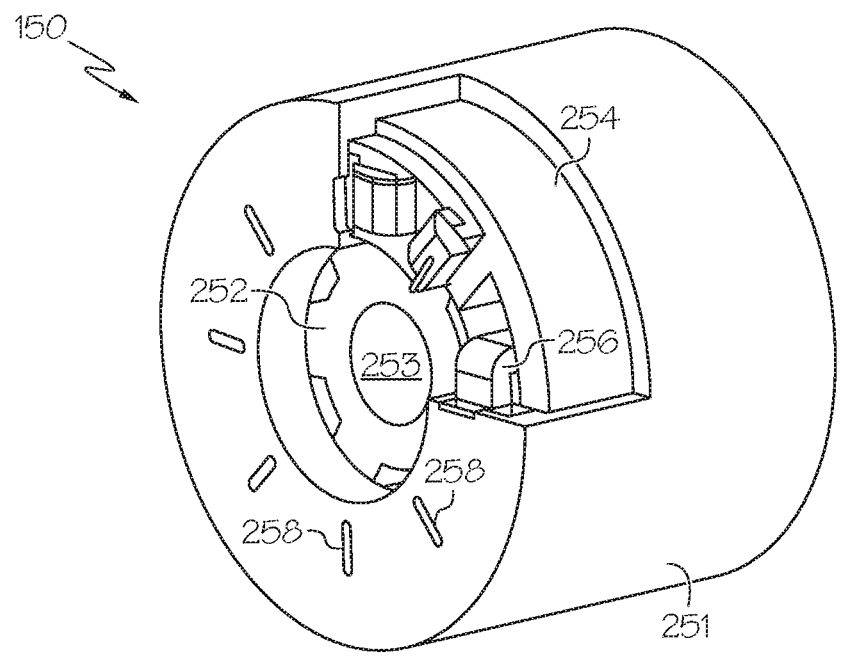
FIG. 2A depicts a perspective view of the vehicle motor assembly showing a cut-away section of a cooling channel therein, according to one or more embodiments shown and described herein.
Figure 2B:
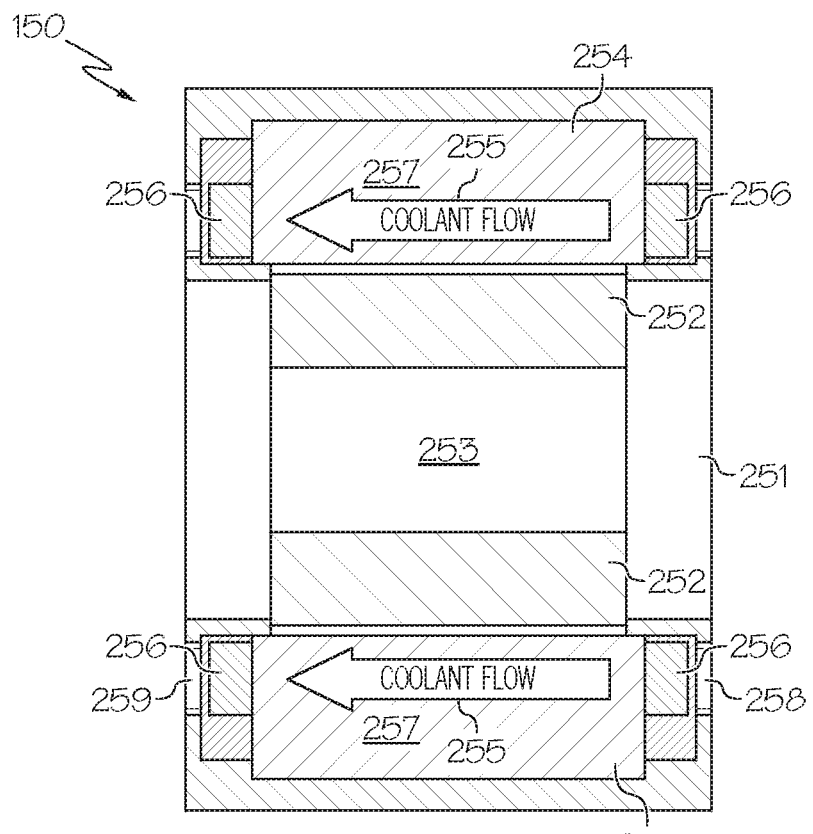
FIG. 2B depicts an axial view of the cooling channel within the vehicle motor assembly, according to one or more embodiments shown and described herein.

FIGS. 1 and 2A-2B generally depict a vehicle 100 having a motor assembly 150 with a cooling channel 257 placed therein. Although the embodiments herein are described in the context of electric vehicles and hybrid vehicles, the embodiments are not limited thereto. Referring to FIG. 1, the vehicle 100 has a chassis 110, the motor assembly 150, a battery pack 180 and four wheels-front wheels 170a, 170b and rear wheels 170c, 170d. The front wheels 170a and 170b are connected to the motor assembly 150. The motor assembly 150 has a curved external surface 152. A plurality of electronic assemblies 160 is disposed on the external surface 152 of the motor assembly 150. In some embodiments, the plurality of electronic assemblies 160 may be electrically coupled together to form a drive circuit that converts direct current (DC) power provided by the bank of batteries 180 into alternating current (AC) power that is used to drive the motor assembly 150 in order to propel the vehicle 100. The plurality of electronic assemblies 160 used in the drive circuit may also be used to convert AC power resulting from the use of the motor assembly 150 and regenerative braking back into DC power for storage in the bank of batteries 180.

FIGS. 2A and 2B depict a perspective view and an axial view respectively of the motor assembly 150 showing a cut-away section of a cooling channel 257. The motor assembly 150 has a rotor 252 having a central aperture 253. A stator 254 having a stator winding 256 is axially mounted around the rotor 252. The rotor 252 and the stator 254 are encapsulated within a casing 251 of the motor assembly 150. The cooling channel 257 is positioned within the stator 254 and circulates a coolant 255 to remove thermal energy generated by the motor assembly 150. A plurality of coolant inlets 258 and a plurality of coolant outlets 259 are located on the casing 251 on opposite ends of the motor assembly 150. The coolant 255 enters through the plurality of coolant inlets 258 and exits through the plurality of coolant outlets 259 after removing thermal energy from the motor assembly 150. The coolant 255 may subsequently flow into a cooling structure such as, but not limited to, a heat sink or a cold plate for disposing the removed thermal energy. The configuration shown in FIGS. 2A and 2B and described above is merely an example and other possible configurations of the motor assembly 150 and the cooling channel 257 are deemed entirely within the scope of this disclosure.

FIG. 3 depicts a side view of an example electronic assembly 300 with a flexible metal base layer 320 mounted on the external surface 152 the motor assembly 150. The electronic assembly 300 provides a thermal management solution for one or more electronic devices 310 of the electronic assembly 300. In some embodiments, the one or more electronic devices 310 may be semiconductor devices such as, without limitation, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the electronic devices 310 may be wide-bandgap semiconductor devices formed from any suitable material such as, but not limited to, silicon carbide (SiC), aluminum nitride (AlN), gallium nitride (GaN), gallium oxide ($Ga_2O_3$), boron nitride (BN), diamond, and/or the like. In some embodiments, such as in hybrid vehicles or electric vehicles, the one or more electronic devices 310 may be electrically coupled to each other to form an inverter circuit or system for driving one or more electric motors.

The example electronic assembly 300 includes a metal substrate 340 disposed on the curved external surface 152 of the motor assembly 150. The metal substrate 340 may be formed from any suitable thermally-conductive metal or metal alloy such as, but not limited to, copper (Cu), oxygen-free Cu, nickel (Ni), aluminum (Al). Cu alloys, Al alloys, direct-bonded-copper substrates, semiconductor (e.g., silicon) substrates and the like. As a non-limiting example, the metal substrate 340 may have a thickness between about 1 millimeter and about 10 millimeters. In other embodiments, the curved external surface 152 of the motor assembly 150 may act as the metal substrate 340.

A dielectric layer 330 is disposed on the metal substrate 340 to provide electrical isolation between the electronic assembly 300 and the motor assembly 150. The dielectric layer 330 may be formed from a dielectric material such as, but not limited to, aluminum oxide, aluminum nitride, silicon nitride, beryllium oxide, silicon carbide, and the like. As a non-limiting example, the dielectric layer 330 may have a thickness between about 50 nanometers and about 200 nanometers.

The electronic assembly 300 includes a flexible metal base layer 320 disposed on the dielectric layer 330. A bonding layer 315 is deposited on the flexible metal base layer 320 for bonding the electronic devices 310 to the flexible metal base layer 320. The bonding layer 315 may be a solder layer or a transient liquid phase (TLP) bonding layer. In some embodiments, the bonding layer 315 maybe deposited at discrete positions on the flexible metal base layer 320, as shown in FIG. 3. In alternative embodiments, the bonding layer 315 may be a continuous layer on the flexible metal base layer 320.

In some embodiments, the flexible metal base layer 320 comprises a stress buffer layer 322 and an encapsulation layer 325 disposed on the dielectric layer 330. The stress buffer layer 322 is formed from a phase change material having a relatively low melting temperature. As non-limiting examples, the phase change material may be indium, tin, or bismuth. As another non-limiting example, the phase change material may be a paraffin wax comprising one or a plurality of saturated hydrocarbons having at least 20 carbon atoms, such as from 20 to 40 carbon atoms and a melting temperature in a range between about 50° C. and about 250° C. As another non-limiting example, the phase change material may be a metal such as, but are not limited to, tin (Sn), indium (In), tin alloys, indium alloys, gallium, n-eicosane (organic), other metals having melting temperatures between about 50° C. and about 250° C., or combinations of these. The melting temperature of the phase change material is lower than the maximum operating temperature of the electronic devices 310. As a non-limiting example, the stress buffer layer 322 may have a thickness between about 50 micrometers and about 200 micrometers. The stress buffer layer 322 may be deposited on the dielectric layer 330 using a process such as, but not limited to, physical vapor deposition, chemical vapor deposition, electroplating, and the like.

As the operating temperature of the electronic devices 310 increases, the stress buffer layer 322 absorbs heat flux and melts. The liquid form of the phase change material isolates the electronic devices 310 from thermally-induced stresses due to mismatch in CTE of the various layers of the electronic assembly 300. Thus, the stress buffer layer 322 increases the flexibility of the electronic assembly 300.

As used herein, the term 'flexible' or 'flexibility' refers to material property inversely proportional to 'stiffness' and measured by the inverse of the elastic modulus (commonly known as Young's modulus) of the material, i.e. the material's resistance to being deformed elastically in response to an applied force. Accordingly, it is desirable to form the stress buffer layer 322 from a phase change material having a low Young's modulus and high flexibility. The flexibility of the stress buffer layer 322 can be varied by varying the content of the phase change material. The stress buffer layer 322 is configured to mitigate thermally-induced stresses of the electronic assembly 300 even when in the solid form due to the low Young's modulus of the phase change material forming the stress buffer layer 322.

An encapsulating layer 325 covers a top surface 321 and side surfaces 323 of the stress buffer layer 322. The encapsulating layer 325 prevents the stress buffer layer 322 from melting and leaking out of the electronic assembly 300 when the electronic devices 310 are operated at temperatures above the melting temperature of the stress buffer layer 322. The encapsulating layer 325 may be formed from a metal having a high melting temperature such as, but not limited to, ruthenium, rhodium, palladium, osmium, iridium, platinum, and the like. The encapsulating layer 325 may be electroplated or sputtered on the stress buffer layer 322 by any known or yet-to-be-developed process. The encapsulating layer 325 has a melting temperature higher than both a melting temperature of the stress buffer layer 322 and a maximum operating temperature of the electronic devices 310. As a non-limiting example, the encapsulating layer may have a thickness between about 50 nanometers and about 500 nanometers.

The stress buffer layer 322 and the encapsulating layer 325 together form the flexible metal base layer 320—a ground plane for the electronic devices 310, which can flex in response to the thermal expansion and/or contraction of the different layers of the electronic assembly 300, while remaining bonded to the electronic devices 310. The structure of the stress buffer layer 322 having a phase change material and encapsulated by the encapsulating layer 325 having a metal of high melting temperature provides the flexible metal base layer 320 a desired flexibility and enhanced heat absorption capacity to mitigate thermally-induced stresses during operation of the electronic devices 310.

The motor assembly 150 includes the cooling channel 257 (shown in FIG. 2B) through which a coolant 255 is circulated to remove thermal energy generated by the motor assembly 150 and the electronic devices 310 at the same time. The coolant 255 enters through the plurality of coolant inlets 258 and exits through the plurality of coolant outlets 259 located on the casing 251 on opposite ends of the motor assembly 150.

Figure 4:
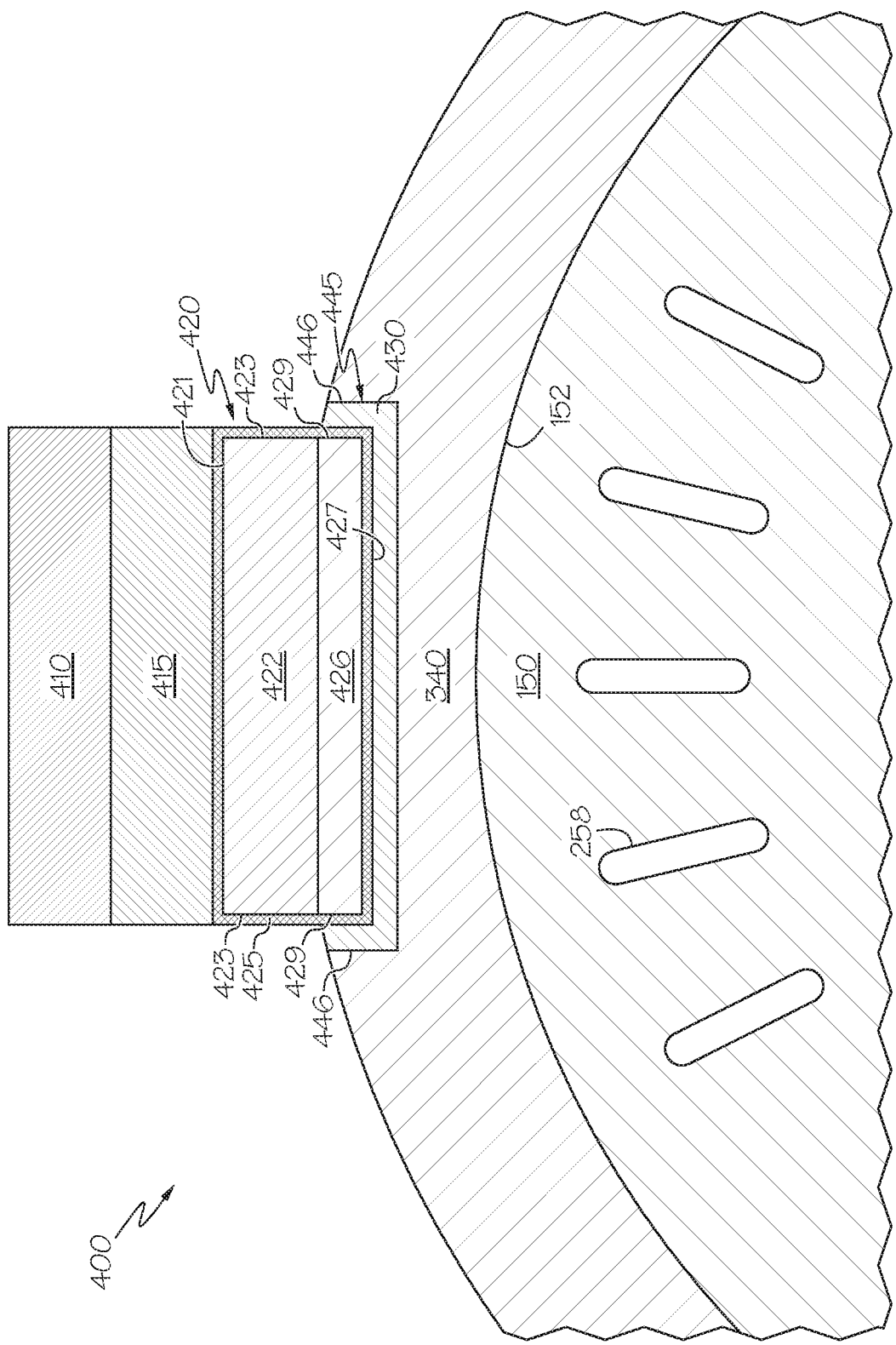
FIG. 4 depicts a side view of another example electronic assembly with a flexible metal base layer with a stress buffer layer mounted on the external surface of the vehicle motor assembly, according to one or more embodiments shown and described herein.

FIG. 4 depicts a side view of another example electronic assembly 400 with a flexible metal base layer 420 with a stress buffer layer 422 mounted on the external surface 152 of the motor assembly 150. The electronic assembly 400 provides a thermal management solution for one or more electronic devices 410 of the electronic assembly 400. While a single electronic device 410 is shown in the embodiment described in FIG. 4, the disclosure is not intended to be limited as such and may include multiple electronic devices 410. The electronic assembly 400 includes the metal substrate 340 disposed on the curved external surface 152 of the motor assembly 150. The metal substrate 340 has a one or more wells 445 formed therein. The inner walls 446 of the one or more wells 445 are coated with a dielectric layer 430 to provide electrical isolation between the electronic assembly 400 and the motor assembly 150. The dielectric layer 430 may be formed from a dielectric material such as, but not limited to, aluminum oxide, a resin, a flexible ceramic and the like. As a non-limiting example, the dielectric layer 430 may have a thickness between about 50 nanometers and about 200 nanometers. In some embodiments, the curved external surface 152 of the motor assembly 150 may act as the metal substrate 340 and have the one or more wells 445 formed therein.

The electronic assembly 400 also has a flexible metal base layer 420 partially disposed on the dielectric layer 430 within the wells 445. A bonding layer 415 is deposited on the flexible metal base layer 420 for bonding the electronic devices 410 to the flexible metal base layer 420. The bonding layer 415 is substantially similar to the bonding layer 315 as described above.

In some embodiments, the flexible metal base layer 420 has a stress buffer layer 422 comprising a phase change material and is substantially similar to the stress buffer layer 322 described above. In some embodiments, the stress buffer layer 422 is coupled to (e.g., electroplated on) a metal layer 426 and together form a singular piece that is placed into the one or more wells 445. The metal layer 426 may be formed from a thermally-conductive metal such as, but not limited to, copper, nickel, aluminum and the like. An encapsulating layer 425 covers a top surface 421 and side surfaces 423 of the stress buffer layer 422 as well as a bottom surface 427 and side surfaces 429 of the metal layer 426. The encapsulating layer 425 is substantially similar to the encapsulating layer 325 described above. The stress buffer layer 422, the metal layer 426 and the encapsulating layer 425 together form the flexible metal base layer 420 that is substantially similar to the flexible metal base layer 320 as described above. In other embodiments, the flexible metal base layer 420 comprises only the stress buffer layer 422 covered by the encapsulating layer 425 and the metal layer 426 is not utilized.

In operation, the coolant 255 enters the motor assembly 150 through the plurality of coolant inlets 258 and flows through the cooling channel 257 (shown in FIG. 2B) to remove thermal energy generated by the motor assembly 150 and the electronic devices 410 at the same time and then exits through the plurality of coolant outlets 259 located on the opposite end of the motor assembly 150.

Figure 5:
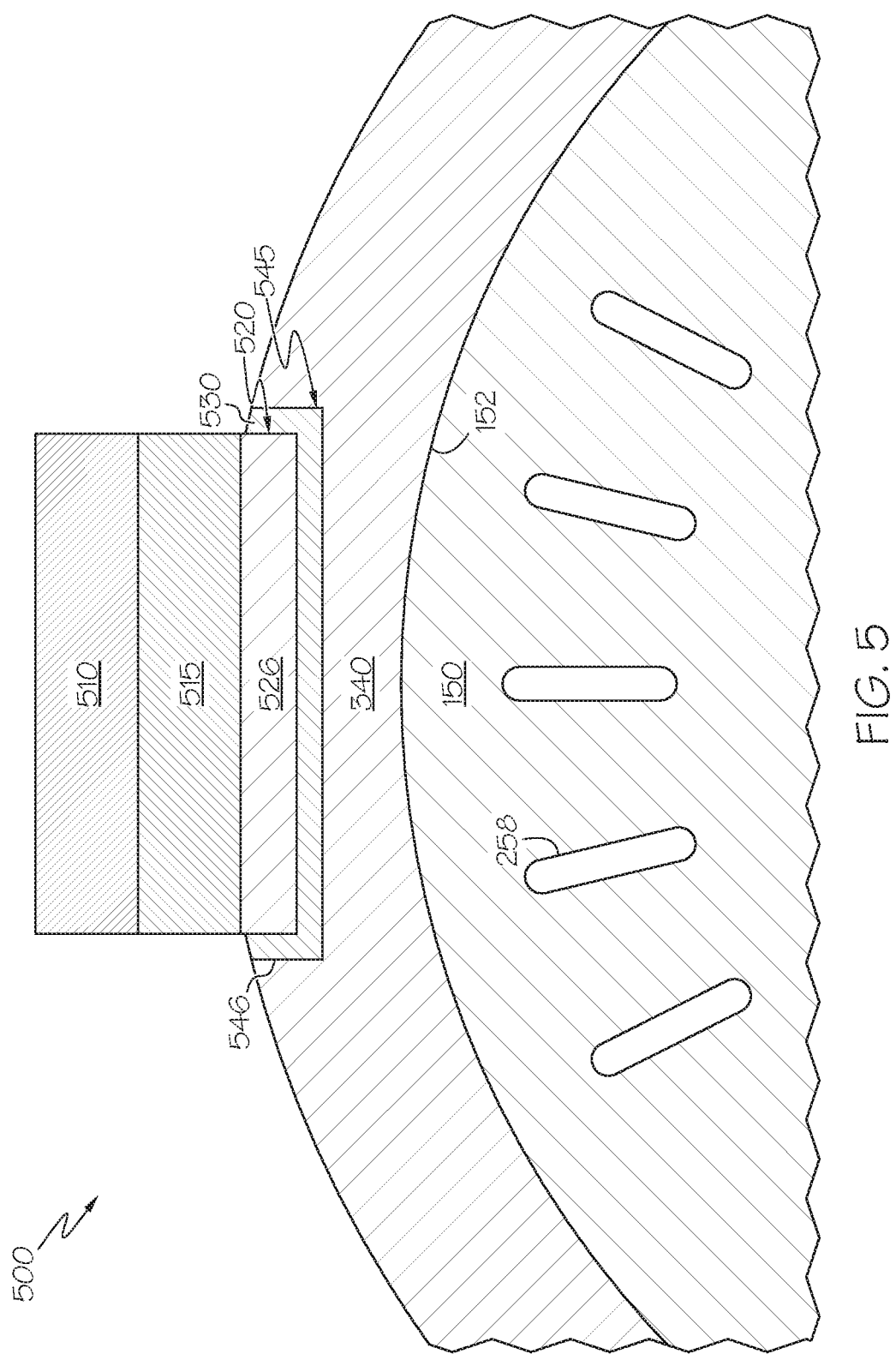
FIG. 5 depicts a side view of another example electronic assembly with a flexible metal base layer without a stress buffer layer mounted on the external surface of the vehicle motor assembly, according to one or more embodiments shown and described herein.

FIG. 5 depicts a side view of another example electronic assembly 500 with a flexible metal base layer 520 without a stress buffer layer mounted on the external surface 152 of the motor assembly 150. The electronic assembly 500 provides a thermal management solution for one or more electronic devices 510 of the electronic assembly 500. While a single electronic device 510 is shown in the embodiment described in FIG. 5, the disclosure is not intended to be limited as such and may include multiple electronic devices 510. The electronic assembly 500 includes the metal substrate 340 disposed on the curved external surface 152 of the motor assembly 150 and having one or more wells 545 formed therein. The inner walls 546 of the one or more wells 545 are coated with a dielectric layer 530, substantially similar to the dielectric layer 430, as described above. In some embodiments, the curved external surface 152 of the motor assembly 150 may act as the metal substrate 340 and have the one or more wells 545 formed therein.

The electronic assembly 500 includes a flexible metal base layer 520 partially disposed on the dielectric layer 530 within the wells 545. A bonding layer 515, substantially similar to the bonding layer 415 described above, is deposited on the flexible metal base layer 520 for bonding the electronic devices 510 to the flexible metal base layer 520. In the embodiment shown in FIG. 5, the flexible metal base layer 520 only includes a metal layer 526, which is substantially similar to the metal layer 426 described above. In the embodiment depicted in FIG. 5, there is no need to provide a stress buffer layer. In operation, the coolant 255 enters the motor assembly 150 through the plurality of coolant inlets 258 and flows through the cooling channel 257 (shown in FIG. 2B) to remove thermal energy generated by the motor assembly 150 and the electronic devices 510 at the same time and then exits through the plurality of coolant outlets 259 located on the opposite end of the motor assembly 150.

Figure 6:
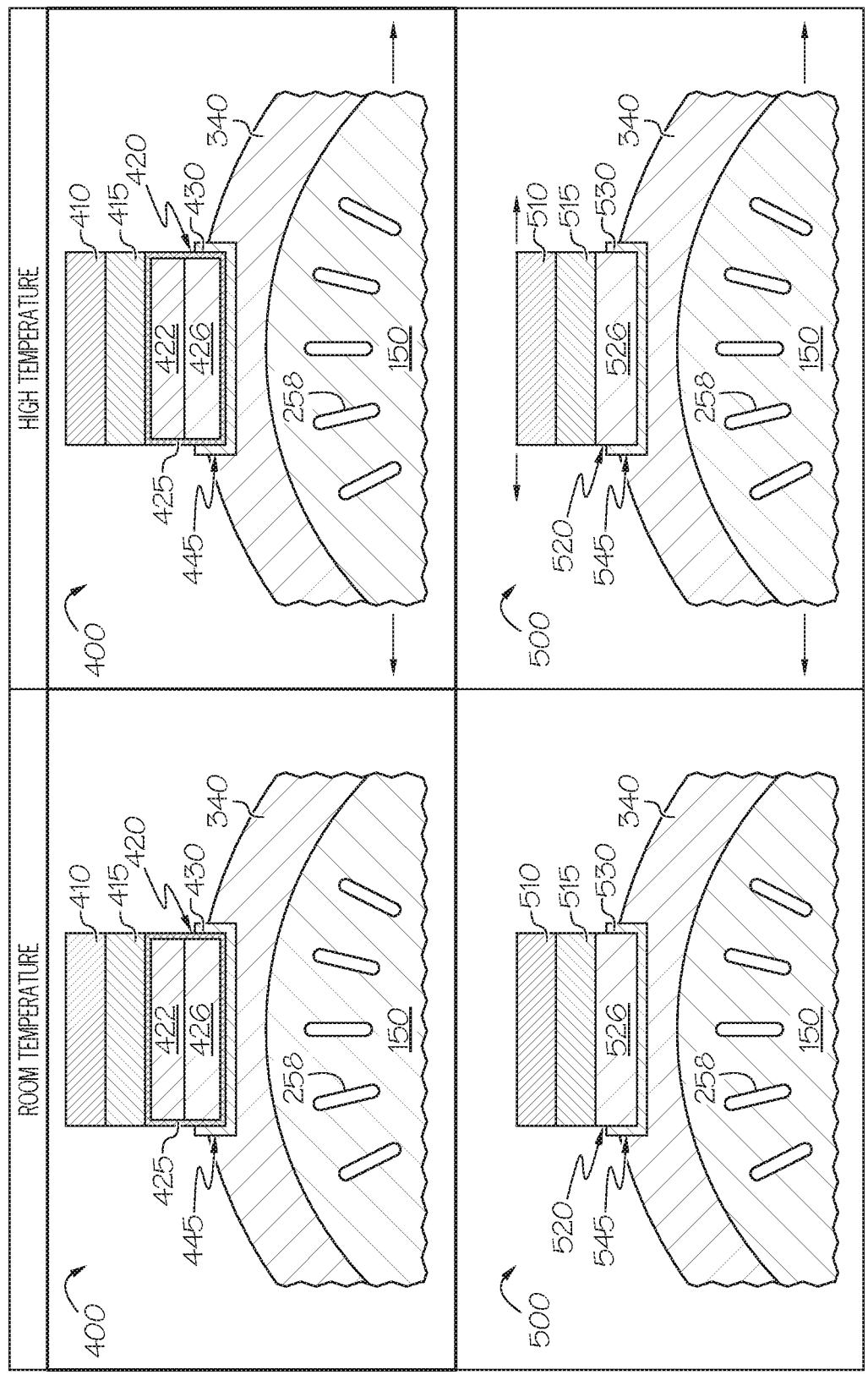
FIG. 6 depicts comparative performances of the example electronic assemblies of FIG. 4 and FIG. 5 at room temperature and at high temperature that cause mismatch in coefficients of thermal expansion (CTE) of the layers of the electronic assemblies, according to one or more embodiments shown and described herein.

FIG. 6 depicts comparative performances of the electronic assembly 400 and the electronic assembly 500 at room temperature and at high operating temperatures that cause mismatch in coefficients of thermal expansion (CTE) of the different layers therein. The left-hand column shows the electronic assemblies 400, 500 at room temperature, while the right-hand column shows the electronic assemblies 400, 500 at high operating temperature, which is greater than 150° C. As shown in FIG. 6, since there are no thermally-induced stresses at room temperature, the configuration of the electronic devices 410, 510 remain unaffected. However, as the operating temperature of the electronic devices 410, 510 and/or the motor assembly 150 rises, the CTE mismatch between the various layers may cause thermally-induced stresses on the electronic assemblies 400, 500.

When the operating temperature of the electronic assembly 400 reaches the melting temperature of the stress buffer layer 422, the stress buffer layer 422 softens and changes from the solid phase to the liquid phase but still remains encapsulated within the encapsulating layer 425. This enables the flexible metal base layer 420 to absorb the thermally-induced stresses and flex around the metal substrate 340 in response to the thermal expansion and/or contraction of the different layers of the electronic assembly 400. The flexible metal base layer 420 thus isolates the electronic devices 410 from the thermal expansion and/or contraction of the metal substrate 340 mounted on the motor assembly 150.

On the other hand, in some embodiments, when the electronic devices 510 of the electronic assembly 500 are operating at a temperature that is above room temperature but not sufficiently high to cause damage to the configuration of the electronic devices 510 due to thermally-induced stresses, a stress buffer layer is not needed and the bonding layer 515 is directly coupled to the metal layer 526 within the wells 545. In this case, though the electronic devices 510 may experience some thermally-induced stresses due to CTE mismatch (shown by arrows adjacent to the electronic device 510 on the right column), the configuration of the electronic devices 510 remain unaffected due to the lower operating temperature.

Electronic devices utilized in applications for hybrid and electric vehicles, such as semiconductor devices may generate a significant amount of heat during operation, which require the bonds between the electronic devices and the metal substrates on which they are configured to be able withstand higher temperatures and thermally-induced stresses due to CTE mismatch. The flexible electronic substrates described and illustrated herein render efficient in-situ thermal management solutions to compensate for the thermally-induced stresses. In different embodiments, the flexible electronic substrates advantageously eliminate the need for additional dedicated cooling mechanisms for the electronic devices due to proximity to one or more cooling channels within the vehicle motor assembly, while also providing a compact package design that incorporates a flexible metal base layer to compensate for thermally-induced stresses generated during operation of the electronic devices.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronic assembly comprising:
   a metal substrate directly disposed on a curved surface;
   a dielectric layer disposed on the metal substrate;
   a flexible metal base layer comprising a stress buffer layer disposed on the dielectric layer and an encapsulating layer encapsulating the stress buffer layer;
   a bonding layer disposed on the flexible metal base layer; and
   one or more electronic devices disposed on the bonding layer, wherein the bonding layer bonds the one or more electronic devices to the flexible metal base layer.

2. The electronic assembly of claim 1, wherein the metal substrate comprises copper, nickel, aluminum or alloys thereof.

3. The electronic assembly of claim 1, wherein the dielectric layer comprises aluminum oxide, aluminum nitride, silicon nitride, beryllium oxide or silicon carbide.

4. The electronic assembly of claim 1, wherein:
   a melting temperature of the encapsulating layer is higher than a melting temperature of the stress buffer layer and a maximum operating temperature of the one or more electronic devices.

5. The electronic assembly of claim 1, wherein the stress buffer layer comprises indium, tin, bismuth or paraffin wax.

6. The electronic assembly of claim 1, wherein the stress buffer layer is deposited by physical vapor deposition, chemical vapor deposition or electroplating.

7. The electronic assembly of claim 1, wherein the encapsulating layer comprises a metal selected from a group consisting of: ruthenium, rhodium, palladium, osmium, iridium, and platinum.

8. The electronic assembly of claim 1, wherein:
   the metal substrate comprises one or more wells formed therein;
   the dielectric layer is disposed within the one or more wells; and
   the flexible metal base layer is at least partially disposed within the one or more wells.

9. The electronic assembly of claim 8, wherein the dielectric layer comprises at least one of aluminum oxide, a resin and a flexible ceramic.

10. The electronic assembly of claim 9, wherein the flexible metal base layer comprises:
   the stress buffer layer comprising indium, tin, bismuth or paraffin wax; and
   wherein a melting temperature of the encapsulating layer is higher than a melting temperature of the stress buffer layer and a maximum operating temperature of the one or more electronic devices.

11. A motor assembly comprising:
   a motor comprising an external surface; and
   one or more electronic assemblies positioned on the external surface of the motor, each electronic assembly comprising:
      a metal substrate directly disposed on the external surface of the motor;
      a dielectric layer disposed on the metal substrate;
      a flexible metal base layer comprising a stress buffer layer disposed on the dielectric layer and an encapsulating layer encapsulating the stress buffer layer;
      a bonding layer disposed on the flexible metal base layer; and
      one or more electronic devices disposed on the bonding layer, wherein the bonding layer bonds the one or more electronic devices to the flexible metal base layer.

12. The motor assembly of claim 11, wherein the metal substrate comprises copper, nickel, aluminum or alloys thereof.

13. The motor assembly of claim 11, wherein the dielectric layer comprises aluminum oxide, aluminum nitride, silicon nitride, beryllium oxide or silicon carbide.

14. The motor assembly of claim 11, wherein:
   a melting temperature of the encapsulating layer is higher than a melting temperature of the stress buffer layer and a maximum operating temperature of the one or more electronic devices.

15. The motor assembly of claim 11, wherein the stress buffer layer comprises indium, tin, bismuth or paraffin wax.

16. The motor assembly of claim 11, wherein the stress buffer layer is deposited by physical vapor deposition, chemical vapor deposition or electroplating.

17. The motor assembly of claim 11, wherein the encapsulating layer comprises a metal selected from a group consisting of: ruthenium, rhodium, palladium, osmium, iridium, and platinum.

18. The motor assembly of claim 11, wherein the dielectric layer comprises at least one of aluminum oxide, a resin and a flexible ceramic.

19. The motor assembly of claim 11, wherein:
   the metal substrate comprises one or more wells formed therein;
   the dielectric layer is disposed within the one or more wells; and
   the flexible metal base layer is at least partially disposed within the one or more wells.

20. The motor assembly of claim 19, wherein the flexible metal base layer comprises:
   the stress buffer layer comprising indium, tin, bismuth or paraffin wax; and
   wherein a melting temperature of the encapsulating layer is higher than a melting temperature of the stress buffer layer and a maximum operating temperature of the one or more electronic devices.

\* \* \* \* \*

UNITED STATES PATENT AND TRADEMARK OFFICE
CERTIFICATE OF CORRECTION

| | |
|---|---|
| PATENT NO. | : 10,999,919 B2 |
| APPLICATION NO. | : 16/508820 |
| DATED | : May 4, 2021 |
| INVENTOR(S) | : Shailesh N. Joshi |

It is certified that error appears in the above-identified patent and that said Letters Patent is hereby corrected as shown below:

On the Title Page

Column 2, item (56), foreign patent documents, cite no. 2, insert --A-- after S55111656.

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*